(12) United States Patent
Inoue et al.

(10) Patent No.: US 8,169,164 B2
(45) Date of Patent: May 1, 2012

(54) LIGHT OUTPUT CONTROL DEVICE FOR LASER LIGHT SOURCE

(75) Inventors: Shuji Inoue, Okayama (JP); Takahiro Kobayashi, Osaka (JP); Hiroshi Mitani, Osaka (JP); Toshiki Onishi, Osaka (JP); Yuichi Nishikoji, Kyoto (JP)

(73) Assignee: Panasonic Corporation, Osaka (JP)

( * ) Notice: Subject to any disclaimer, the term of this patent is extended or adjusted under 35 U.S.C. 154(b) by 236 days.

(21) Appl. No.: 12/669,279

(22) PCT Filed: Jun. 6, 2008

(86) PCT No.: PCT/JP2008/001444
§ 371 (c)(1),
(2), (4) Date: Jan. 15, 2010

(87) PCT Pub. No.: WO2009/011085
PCT Pub. Date: Jan. 22, 2009

(65) Prior Publication Data
US 2010/0181939 A1 Jul. 22, 2010

(30) Foreign Application Priority Data
Jul. 18, 2007 (JP) .................................. 2007-186921

(51) Int. Cl.
*H05B 37/00* (2006.01)
(52) U.S. Cl. ........ 315/318; 315/312; 315/360; 315/308; 315/224; 372/29.014; 372/38.01; 372/38.02; 372/38.07; 348/655; 250/205; 250/559.1; 250/559.13
(58) Field of Classification Search .................. 315/312, 315/318, 320, 360, 307, 308, 294, 291, 224; 372/29.021, 29.011, 29.014, 29.015, 38.01, 372/38.02, 38.07, 31; 250/205, 552, 559.1, 250/559.13, 559.15; 348/655, 750; 345/77, 345/82, 83, 88, 102, 690
See application file for complete search history.

(56) References Cited

U.S. PATENT DOCUMENTS
7,052,138 B2 5/2006 Matsui
(Continued)

FOREIGN PATENT DOCUMENTS
JP 2001-244556 9/2001
(Continued)

OTHER PUBLICATIONS
Notification of Transmittal of Copies of Translation of the International Preliminary Report on Patentability issued Feb. 9, 2010 in PCT/JP2008/001444.
(Continued)

*Primary Examiner* — Haiss Philogene
(74) *Attorney, Agent, or Firm* — Wenderoth, Lind & Ponack, L.L.P.

(57) ABSTRACT

A light output control device for laser light sources for respective RGB colors includes, for each of RGB, three sets, each including: a semiconductor laser for one of the colors; light output detection unit for detecting a light output from the semiconductor laser; light output adjustment unit for updating a light output target value; light output control unit for controlling the semiconductor laser based on the updated light output target value; and division unit for dividing the light output by an output from the light output adjustment unit to obtain a ratio of the rising of the light output, and includes rising determination unit for determining, based on results obtained by the respective division unit, a semiconductor laser with a slowest rising and outputs light output adjustment values for the respective colors. The light output adjustment unit update their respective light output target values based on the light output adjustment values. The light output control unit causes their respective corresponding semiconductor lasers to operate in accordance with a semiconductor laser whose rising time is slowest, based on the updated light output target values to keep RGB color balance upon start-up.

5 Claims, 6 Drawing Sheets

U.S. PATENT DOCUMENTS

| | | | |
|---|---|---|---|
| 7,303,284 B2 | 12/2007 | Imade | |
| 7,508,856 B2 * | 3/2009 | Kubo | 372/38.02 |
| 7,521,667 B2 * | 4/2009 | Rains et al. | 250/228 |
| 7,873,087 B2 * | 1/2011 | Morikawa et al. | 372/38.02 |
| 2003/0219049 A1 | 11/2003 | Suda | |
| 2005/0068503 A1 | 3/2005 | Imade | |
| 2005/0073845 A1 | 4/2005 | Matsui | |
| 2006/0170883 A1 | 8/2006 | Matsui | |
| 2009/0274182 A1 | 11/2009 | Morikawa et al. | |

FOREIGN PATENT DOCUMENTS

| | | |
|---|---|---|
| JP | 2001-320122 | 11/2001 |
| JP | 2004-184852 | 7/2004 |
| JP | 2005-107211 | 4/2005 |
| WO | 2007/007733 | 1/2007 |

OTHER PUBLICATIONS

International Search Report issued Jul. 1, 2008 in International (PCT) Application No. PCT/JP2008/001444.

* cited by examiner

LIGHT OUTPUT CONTROL DEVICE FOR LASER LIGHT SOURCE

The present application claims the priority of Japanese Patent Application No. 2007-186921, filed on Jul. 18, 2007 in Japan, and the contents of which are incorporated herein by reference.

BACKGROUND OF THE INVENTION

1. Technical Field

The present invention relates to a light output control device for laser light sources used as a backlight of a display.

2. Background Art

In a laser light source device used as a backlight of a display, to reproduce correct colors, the magnitudes of respective RGB light outputs need to have specified values. Upon a normal operation, a light output from a laser light source is detected and fed back to drive unit, whereby the light output is controlled to a specified light output. This is generally called APC control.

FIG. 6 is a block diagram showing a configuration of a conventional light output control device. This light output control device includes, for the respective RGB colors, light output control unit 21, 22, and 23; semiconductor lasers 41, 42, and 43 that output lights of the respective colors; and light output detection unit 31, 32, and 33. In the conventional light output control device, APC control is performed on a color-by-color basis. For each color, light outputs from the semiconductor lasers 41, 42, and 43 are controlled by the light output control unit 21, 22, and 23 such that the light outputs from the semiconductor lasers 41, 42, and 43 detected by the light output detection unit 31, 32, and 33 match their respective light output target values. The configuration is the same for all the RGB colors and control is independently performed such that light outputs from the respective semiconductor lasers match their respective RGB light output target values which are used to obtain luminance required for a display backlight.

SUMMARY OF THE INVENTION

However, the semiconductor laser has a temperature property of light output, which changes depending on temperature. Particularly, it is highly likely that an optimum temperature has not been reached upon start-up, and also when temperature control is performed, it takes time for the temperature to stabilize. Moreover, there is a possibility that a difference may occur in temperature stabilization time between RGB semiconductor lasers. In this case, light outputs from the semiconductor lasers are not stabilized and even when APC control is performed the light outputs do not rise in accordance with estimated responses. Thus, the rising of RGB light outputs do not match one another and there is a possibility that light of colors different than expected may come out and thus it is not preferable as a display backlight.

Particularly, when a wavelength conversion element made of a semiconductor laser and a nonlinear crystal is used for a G (green) light source, the wavelength conversion element needs to be heated to a specified temperature. Hence, it requires time for the temperature of the G light source to stabilize and then for light outputs to stabilize. Thus, there may be significant difference between the rising of G-light source and the rising of R-light source on start-up, and also there may be significant difference between the rising of G-light source and the rising of B light source on start-up.

An object of the present invention is to provide a light output control device capable of preventing color balance from being lost, by causing the rising of light outputs from RGB light sources to match one another.

In order to solve the above problems, according to the present invention, there is provided a light output control device for laser light sources that controls light outputs from laser light sources for respective RGB colors, the light output control device includes, for each of RGB, three sets, each including: (a) a semiconductor laser that outputs a light of one of the RGB colors; (b) light output detection unit for detecting a light output from the semiconductor laser; (c) light output adjustment unit for updating a light output target value; (d) light output control unit for controlling the semiconductor laser based on the updated light output target value; and (e) division unit for dividing the output from the light output detection unit by an output from the light output adjustment unit to obtain a ratio of the rising of the light output from the semiconductor laser, the light output control device further includes rising determination unit for determining, based on detection results obtained by the respective division unit for the respective RGB, a rising of output of the semiconductor laser with a slowest rising from among the semiconductor lasers for the respective RGB colors and outputs light output adjustment values for the respective semiconductor lasers for the respective RGB, wherein the light output adjustment unit for the respective RGB update their respective light output target values based on the light output adjustment values for the respective RGB outputted from the rising determination unit, and the light output control unit for the respective RGB causes their respective corresponding semiconductor lasers to operate in accordance with a semiconductor laser whose light output rising time is slowest, based on the updated light output target values to keep RGB color balance upon start-up.

Further, the rising determination unit may determine speeds of rising of light outputs from the semiconductor lasers for the respective RGB by comparing magnitudes of the ratios of rising obtained by dividing outputs from the light output detection unit for the respective RGB respectively by outputs from the light output adjustment unit for the respective RGB.

Furthermore, the rising determination unit may (i) output "1" for a light output with a slowest rising among the RGB; and (ii) output, for each of other light outputs, a value obtained by dividing a ratio of the rising of the light output with the slowest rising by a ratio of the rising of the light output, as the light output adjustment values that adjust the light output target values for the respective RGB, based on the ratios of rising obtained by dividing outputs from the light output detection unit for the respective RGB respectively by outputs from the light output adjustment unit for the respective RGB.

Further, the rising determination unit, before a fixed period of time from start-up has elapsed, may output the light output adjustment values by performing the predetermined operation and after the fixed period of time from start-up has elapsed, output, for all the RGB light outputs, a fixed value "1" as the light output adjustment value so as not to perform a rising adjustment operation.

Furthermore, the light output adjustment unit for the respective RGB may multiply their respective light output target values by their respective corresponding light output adjustment values outputted from the rising determination unit to update the light output target values to new light output target values.

According to a light output control device for laser light sources of the present invention, during a fixed period of time from start-up of a display and before light outputs from the laser light sources are stabilized, the rising of respective RGB light outputs are determined and control is performed such that rising of light sources other than the slowest light source follow rising of the slowest light source, whereby the rising of the respective RGB match one another, enabling to prevent color balance from being lost.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
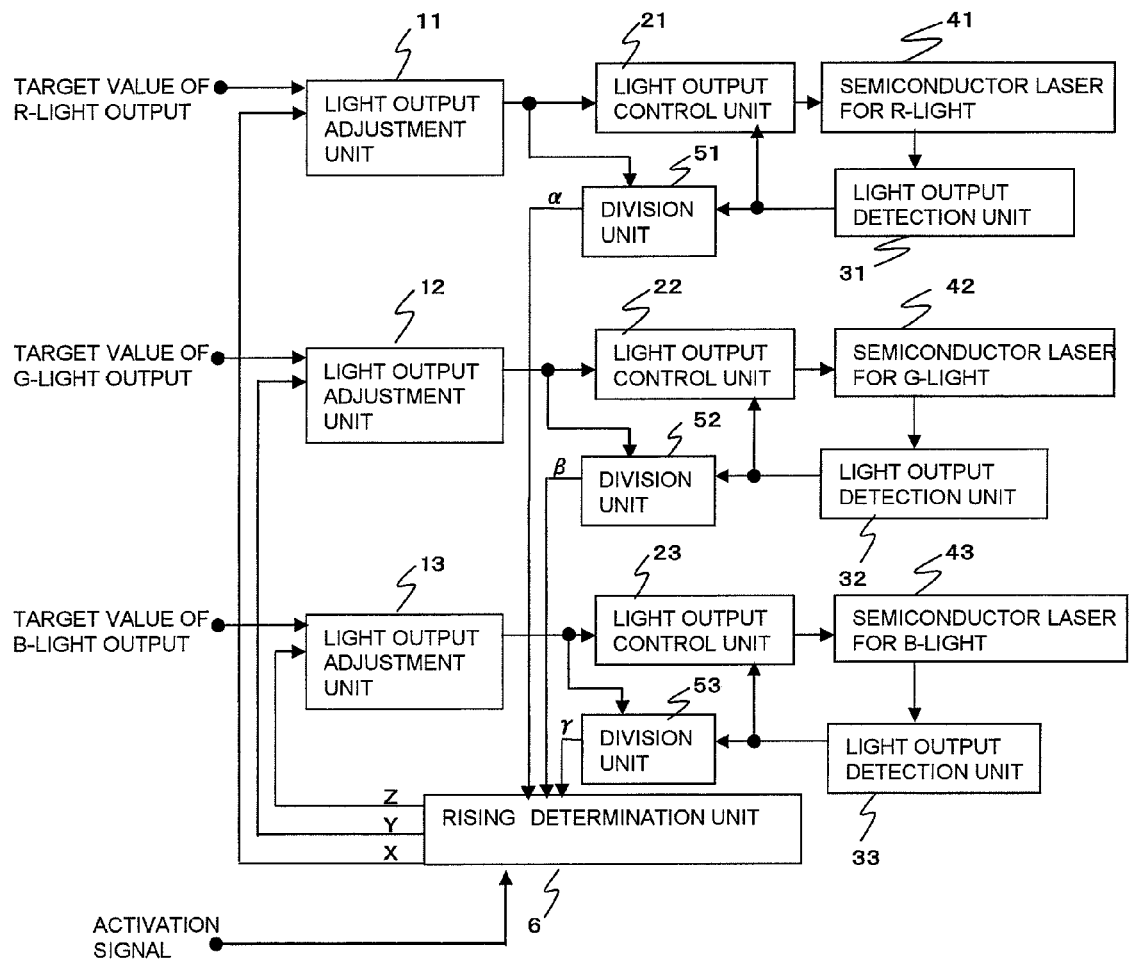
FIG. 1 is a block diagram showing a configuration of a light output control device according to a first embodiment of the present invention.

A light output control device for semiconductor laser light sources according to an embodiment of the present invention will be described below with reference to the accompanying drawings. Note that substantially the same members are denoted by the same reference numerals throughout the drawings.

First Embodiment

A configuration of a light output control device for laser light sources according to a first embodiment of the present invention will be described with reference to FIGS. 1, 2, and 3. FIG. 1 is a block diagram showing a configuration of a light output control device for laser light sources according to the first embodiment of the present invention. The light output control device includes, for each of three colors R (red), G (green), and B (blue), three sets of: light output adjustment unit 11, 12, and 13; light output control unit 21, 22, and 23; semiconductor lasers 41, 42, and 43 that output lights of the respective RGB colors; division unit 51, 52, and 53; and light output detection unit 31, 32, and 33. The light output control device also includes rising determination unit 6. The light output adjustment unit 11, 12, and 13 update their respective RGB light output target values. The light output control unit 21, 22, and 23 respectively control light outputs from the semiconductor lasers 41, 42, and 43 based on the updated light output target values. The light output detection unit 31, 32, and 33 detect light outputs from the semiconductor lasers 41, 42, and 43 for the respective colors. The division unit 51, 52, and 53 divide the light outputs detected by the light output detection unit 31, 32, and 33 respectively by outputs from the light output adjustment unit 11, 12, and 13, and the rising determination unit 6 determines speeds of rising of the respective RGB light outputs.

Outputs from the light output detection unit 31, 32, and 33 respectively enter the division unit 51, 52, and 53 where outputs from the light output adjustment unit 11, 12, and 13 are respectively divided by the outputs from the light output detection unit 31, 32, and 33. Accordingly, rising ratios of the light output detection unit 31, 32, and 33 with the magnitudes of outputs from the light output adjustment unit 11, 12, and 13 being 1 can be obtained. Outputs from the division unit 51, 52, and 53 each have a value of 1 or less. Such values for RGB are respectively represented by $\alpha$, $\beta$, and $\gamma$. These values enter the rising determination unit 6 and the rising determination unit 6 determines a light source with the slowest rising and outputs light output adjustment values X, Y, and Z that adjust rising of light sources other than the light source with the slowest rising. The light output adjustment values X, Y, and Z respectively enter the light output adjustment unit 11, 12, and 13 to update the respective light output target values. Based on the updated light output target values, the light output control unit 21, 22, and 23 respectively control the semiconductor lasers 41, 42, and 43 to obtain their respective target light outputs. For light output target value adjustment, an adjustment operation is performed only during the fixed period of time from start-up by an start-up signal, which is turned on only during a fixed period of time from start-up of a display.

Figure 2:
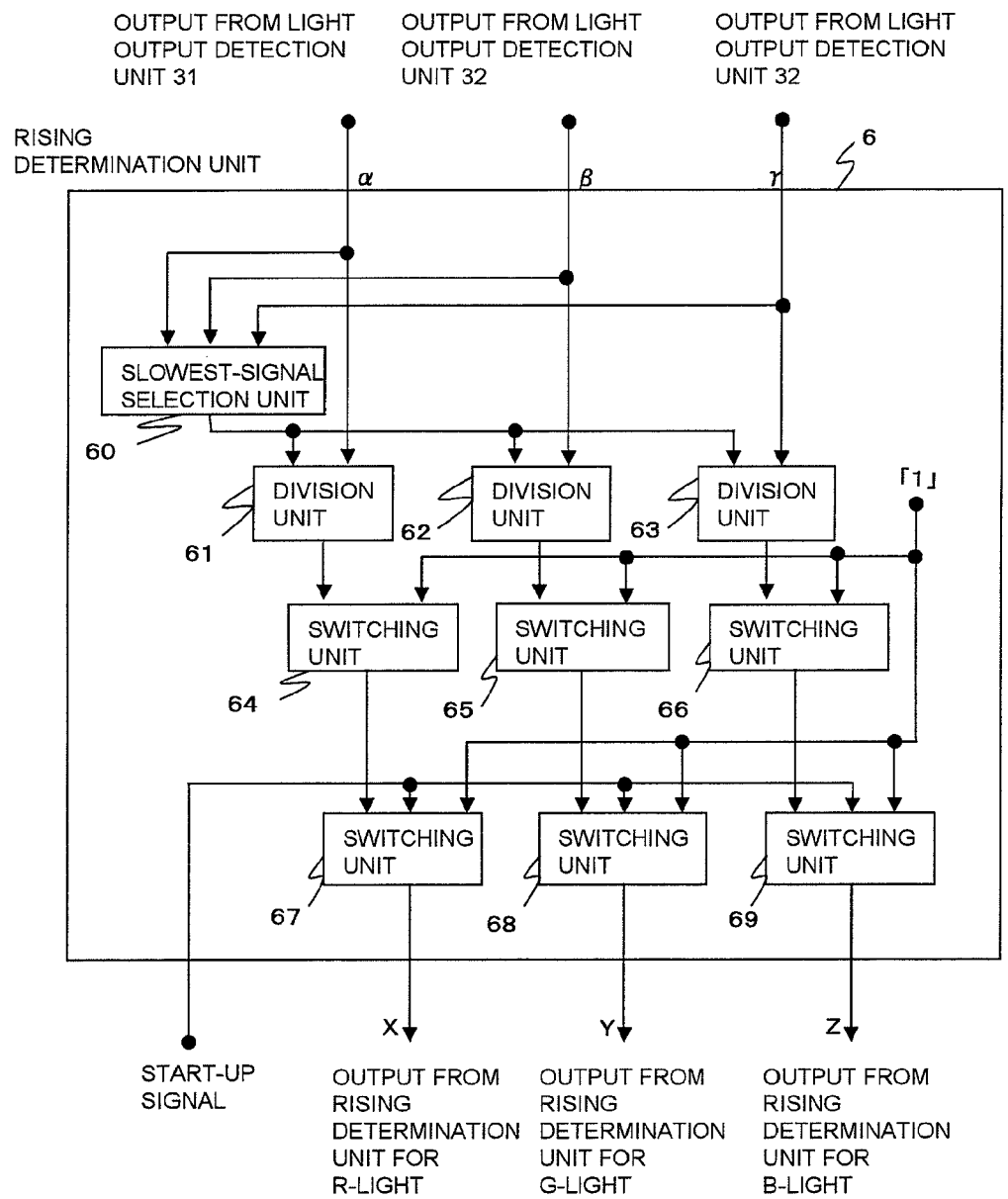
FIG. 2 is a block diagram showing a detailed configuration of rising determination unit in FIG. 1.

FIG. 2 is a block diagram showing an internal configuration of the rising determination unit 6. The rising determination unit 6 includes a slowest-signal selection unit 60, division unit 61, 62, and 63, and switching unit 64, 65, 66, 67, 68, and 69. In the rising determination unit 6, start-up signals $\alpha$, $\beta$, and $\gamma$ which respectively indicate the rising of the semiconductor lasers 41, 42, and 43 for the respective RGB colors enter the slowest-signal selection unit 60. The slowest-signal selection unit 60 selects and outputs a signal with the smallest value from among the signals $\alpha$, $\beta$, and $\gamma$. Therefore, one of RGB light outputs that has the slowest rising can be selected and outputted.

(a) When $\alpha$ is the one selected by and outputted from the slowest-signal selection unit 60, the division unit 61 outputs "1". When the output from the slowest-signal selection unit 60 is other than $\alpha$, the division unit 61 outputs a result obtained by dividing the output from the slowest-signal selection unit 60 by $\alpha$. The output is further outputted as it is from the switching unit 64.

(b) Likewise, when $\beta$ is the one selected by and outputted from the slowest-signal selection unit 60, the division unit 62 outputs "1". When the output from the slowest-signal selection unit 60 is other than $\beta$, the division unit 62 outputs a result obtained by dividing the output from the slowest-signal signal selection unit 60 by $\beta$. The output is further outputted as it is from the switching unit 65.

(c) Likewise, when $\gamma$ is the one selected by and outputted from the slowest-signal selection unit 60, the division unit 63 outputs "1". When the output from the slowest-signal selection unit 60 is other than $\gamma$, the division unit 63 outputs a result obtained by dividing the output from the slowest-signal signal selection unit 60 by $\gamma$. The output is further outputted as it is from the switching unit 66.

Furthermore, an start-up signal which is turned on only during a fixed period of time from start-up is inputted to the switching unit 67, 68, and 69 using a display start-up signal as a trigger.

(d) The switching unit 67 outputs an output from the switching unit 64 when the start-up signal is on, and outputs "1" when the start-up signal is off.

(e) Likewise, the switching unit 68 outputs an output from the switching unit 65 when the start-up signal is on, and outputs "1" when the start-up signal is off.

(f) Likewise, the switching unit 69 outputs an output from the switching unit 66 when the start-up signal is on, and outputs "1" when the start-up signal is off.

The outputs from the switching unit 64, 65, and 66 respectively serve as light output adjustment values X, Y, and Z of the rising determination unit.

Figure 3:
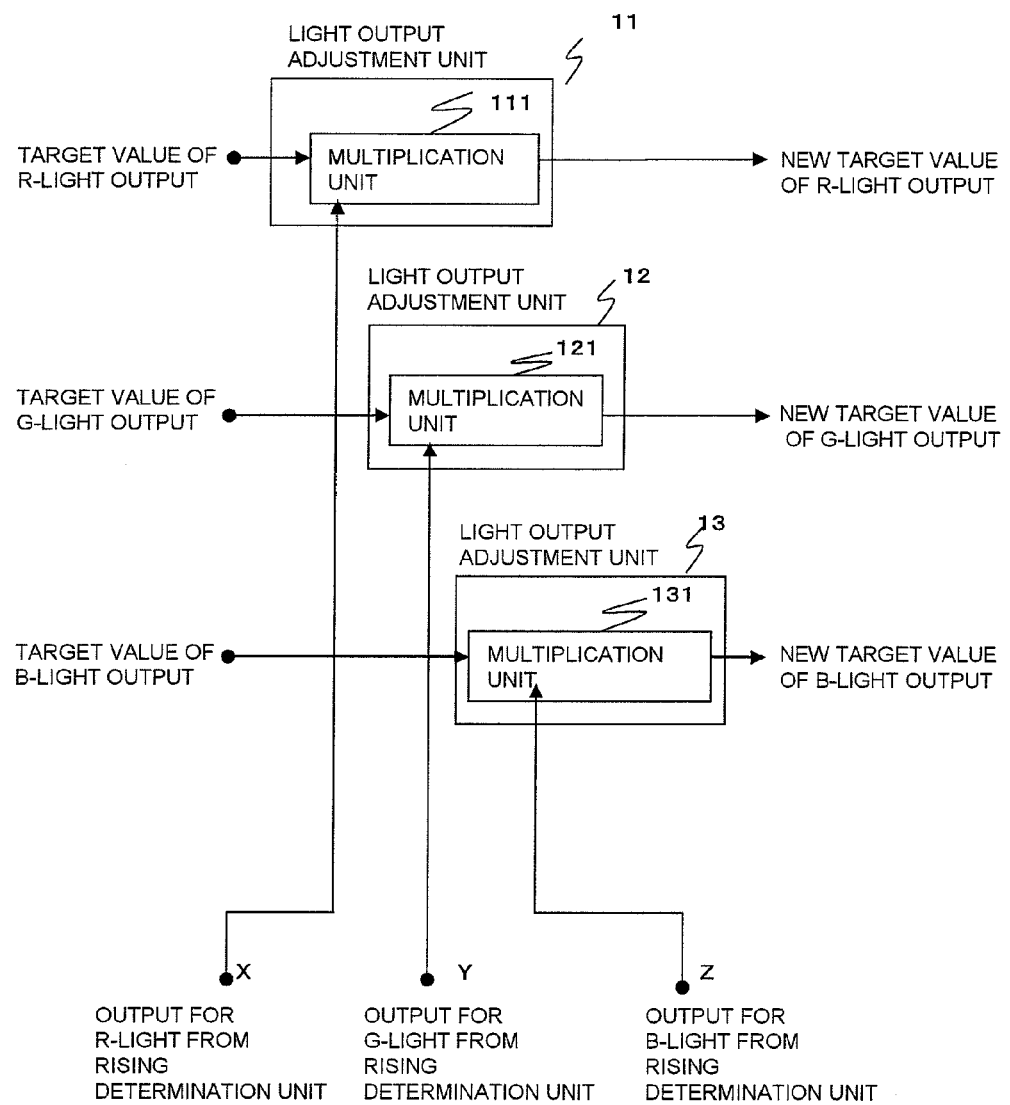
FIG. 3 is a block diagram showing an internal configuration of each light output adjustment unit in FIG. 1.

FIG. 3 is a block diagram showing an internal configuration of each of the light output adjustment unit 11, 12, and 13. The light output adjustment unit 11, 12, and 13 for the respective RGB include, independently for the respective RGB, multiplication unit of multiplying light output target values for the respective RGB respectively by light output adjustment values X, Y, and Z outputted from the rising determination unit 6 and thereby generate new light output target values.

(a) The one for an R-light output will be described. Multiplication unit 111 multiplies an R-light output target value by a light output adjustment value X from the rising determination unit 6, to update the R-light output target value to a new R-light output target value. This value enters the light output control unit 21.

(b) As with the above, for the one for a G-light output, multiplication unit 121 multiplies a G-light output target value by a light output adjustment value Y from the rising determination unit 6, to update the G-light output target value to a new G-light output target value. This value enters the light output control unit 22.

(c) As with the above, for the one for a B light output, multiplication unit 131 multiplies a B-light output target value by a light output adjustment value Z from the rising determination unit 6, to update the B-light output target value to a new B-light output target value. This value enters the light output control unit 23.

As described above, by the light output adjustment unit 11, 12, and 13, new light output target values for respective RGB light outputs, which are updated using light output adjustment values X, Y, and Z can be obtained.

Hence, by using, upon a next control operation, the new light output target values which are updated for the respective RGB light outputs, the rising of the respective RGB light outputs can match one another, enabling to keep a balance between light outputs.

Figure 4:
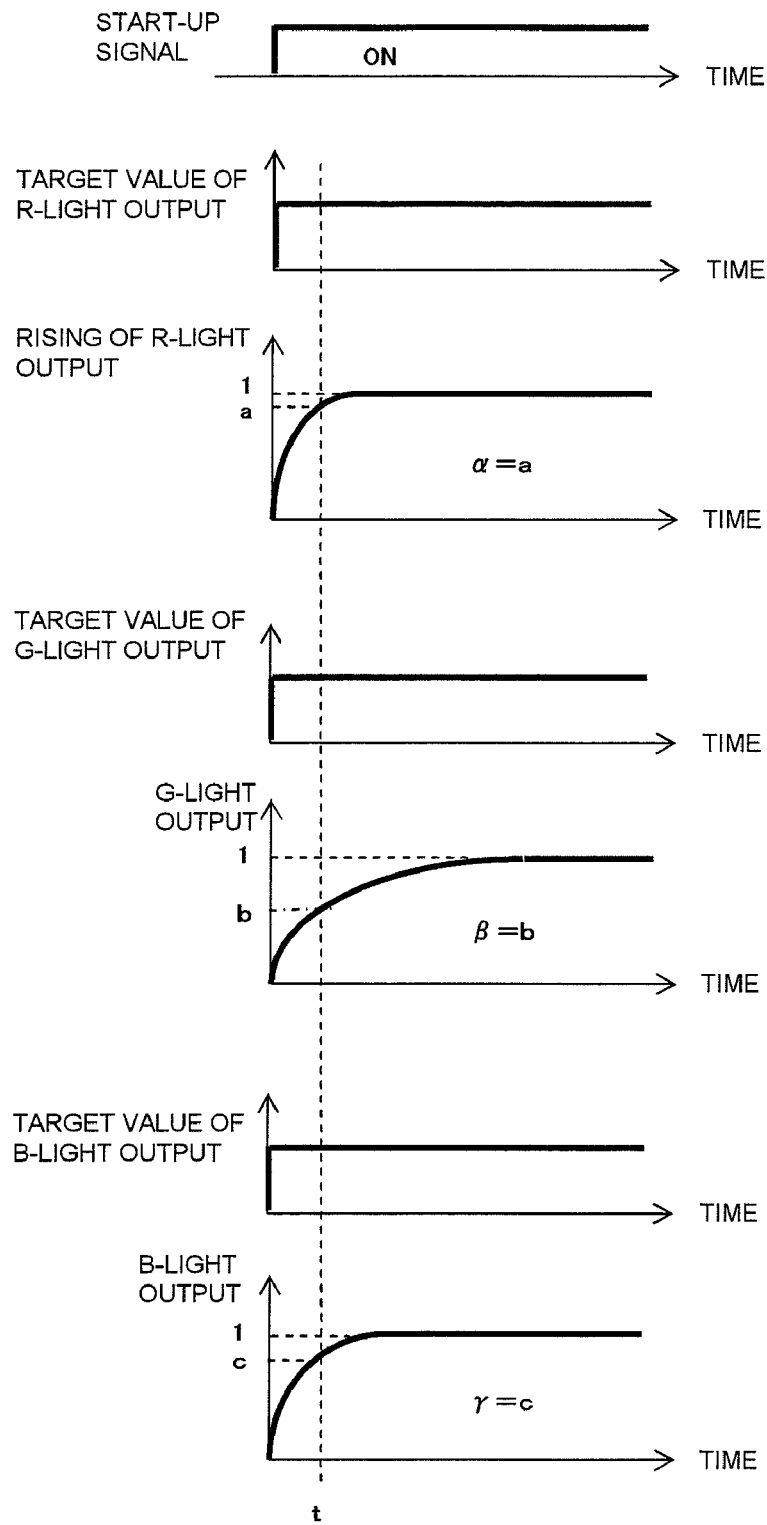
FIG. 4 is a schematic diagram showing the relationship between a light output target value before update and a rising of a light output in the first embodiment of the present invention.
Figure 5:
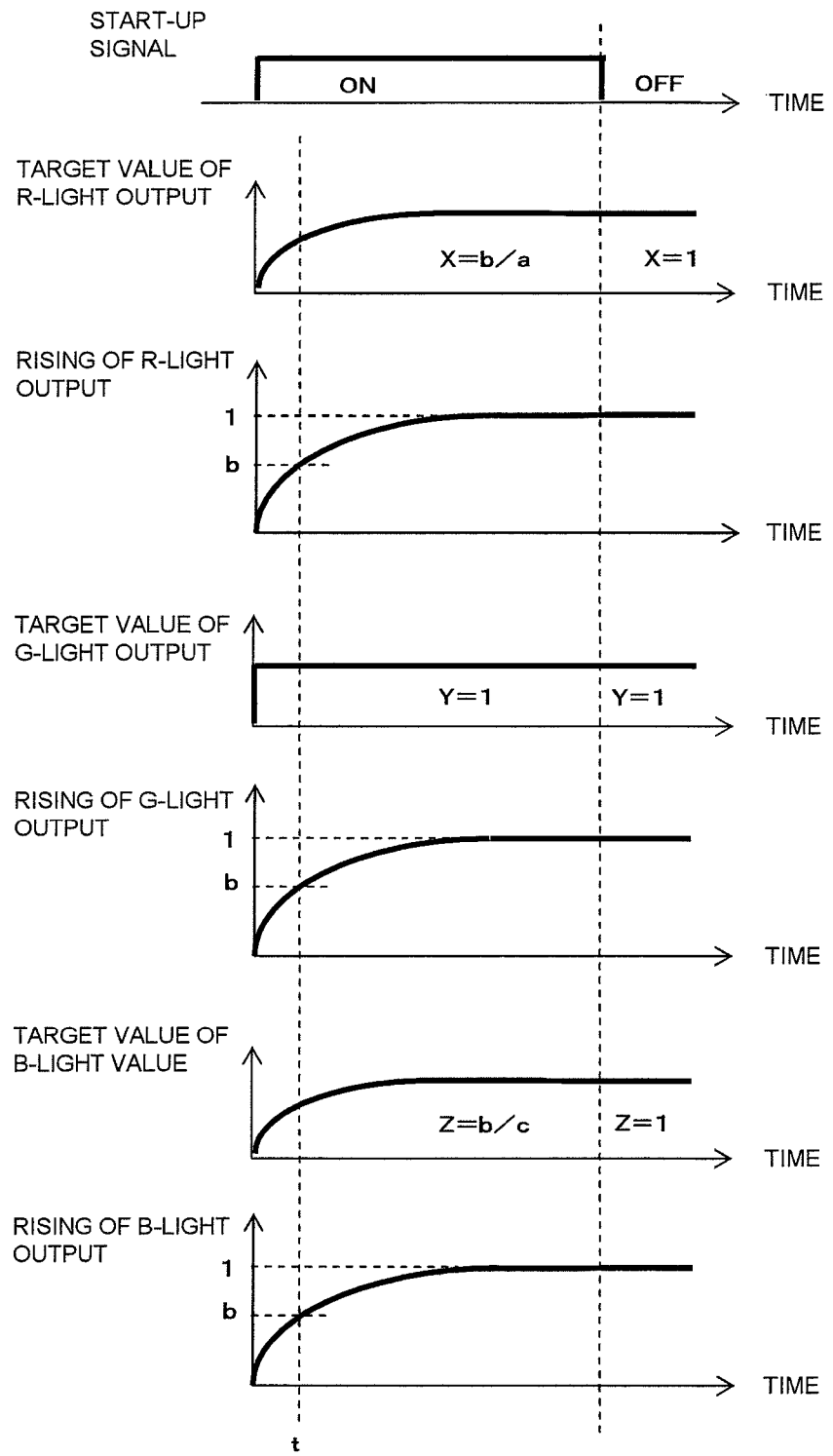
FIG. 5 is a schematic diagram showing the relationship between a light output target value after update and a rising of a light output in the first embodiment of the present invention.
Figure 6:
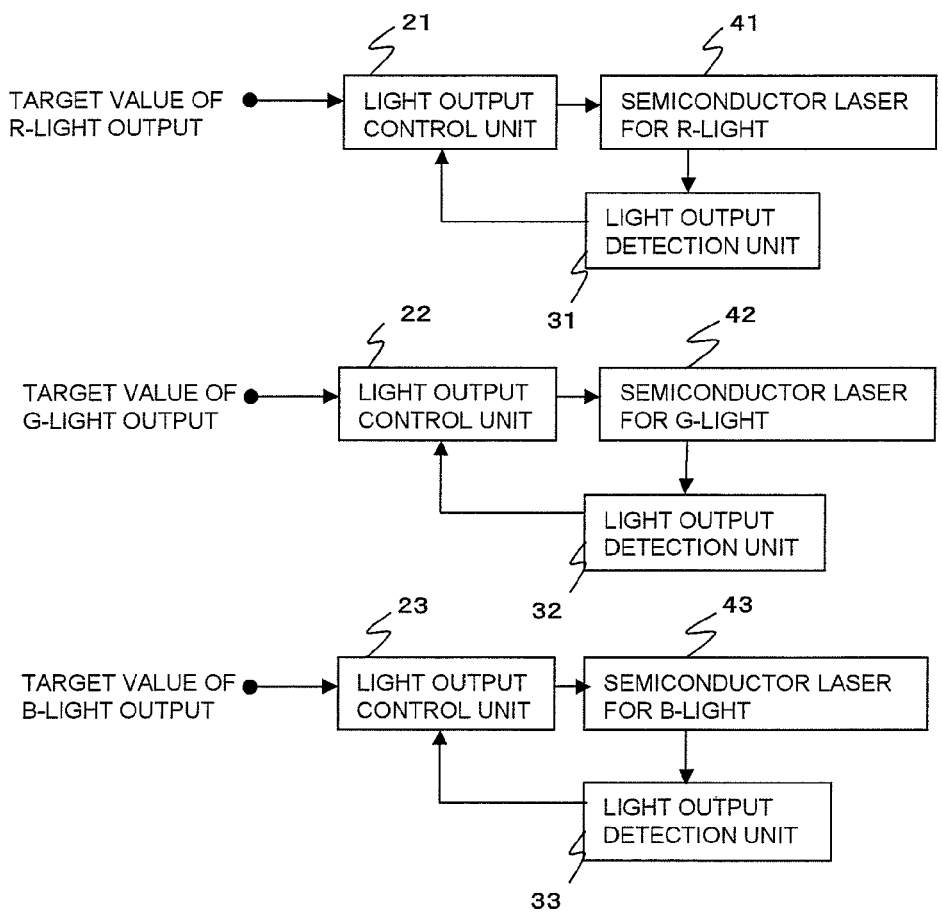
FIG. 6 is a block diagram showing a configuration of a conventional light output control device.

Next, specific operations will be described with reference to FIGS. 2, 4, and 5. FIG. 4 is a schematic diagram showing the relationship between a light output target value before update and a rising of a light output for each of RGB. FIG. 5 is a schematic diagram showing the relationship between an updated and new light output target value and a rising of a light output from the relationship between a light output target value and a rising of a light output for each of RGB in FIG. 4. In FIG. 4, the light output target values rising in a step (rectangular) manner. In this case, it is assumed that the rising of G-light is slower than those of R-light and B-light. In FIG. 4, the rising for when observed at a time point "t" are respectively a, b, and c, as shown in FIG. 4. In this case, $0 \leq a$, b, and $c \leq 1$ and they respectively correspond to the previous start-up signals $\alpha$, $\beta$, and $\gamma$ and thus $\alpha=a$, $\beta=b$, and $\gamma=c$. In the case of FIG. 4, since b is smallest, the output from the slowest-signal selection unit 60 is b.

First, a detailed operation of the rising determination unit 6 in FIG. 2 will be described with reference to the relationship between a light output target value before update and a rising of a light output in FIG. 4.

(a) When "a" is smallest, it indicates that the rising of an R light output itself is slowest. Thus, the switching unit 64 does not need to adjust the rising of the R light output and accordingly selects "1". On the other hand, in other cases, a result obtained by the division unit 61 dividing an output from the slowest-signal selection unit 60 by "a" is outputted. Specifically, in the case of FIG. 4, since b is smallest, an output from the switching unit 64 is b/a.

(b) Likewise, when b is smallest, it indicates that the rising of G-light output itself is slowest. Thus, the switching unit 65 does not need to adjust the rising of the G-light output and accordingly selects "1". On the other hand, in other cases, a result obtained by the division unit 62 dividing an output from the slowest-signal selection unit 60 by b is outputted. Specifically, in the case of FIG. 4, since b is smallest, an output from the switching unit 65 is "1".

(c) Likewise, when c is smallest, it indicates that the rising of B-light output itself is slowest. Thus, the switching unit 66 does not need to adjust the rising of the B-light output and accordingly selects "1". On the other hand, in other cases, a result obtained by the division unit 63 dividing an output from the slowest-signal selection unit 60 by c is outputted. Specifically, in the case of FIG. 4, since b is smallest, an output from the switching unit 66 is b/c.

Furthermore, an start-up signal which is turned on only during a fixed period of time from start-up is inputted to the switching unit 67, 68, and 69 using a display start-up signal as a trigger.

(d) The switching unit 67 selects an output from the switching unit 64 during the start-up signal being on, and otherwise selects "1" to stop adjustment. Specifically, in the case of FIG. 4, b/a is outputted during a period during which the start-up signal is on and "1" is outputted during other periods. This serves as a light output adjustment value X.

(e) Likewise, the switching unit 68 selects an output from the switching unit 65 during the start-up signal being on, and otherwise selects "1" to stop adjustment. Specifically, in the case of FIG. 4, "1" is outputted during a period during which the start-up signal is on and "1" is also outputted during other periods. This serves as a light output adjustment value Y.

(f) Likewise, the switching unit 69 selects an output from the switching unit 66 during the start-up signal being on, and otherwise selects "1" to stop adjustment. Specifically, in the case of FIG. 4, b/c is outputted during a period during which the start-up signal is on and "1" is outputted during other periods. This serves as a light output adjustment value Z.

In the above-described manner, light output adjustment values X, Y, and Z for calculating new light output target values which are used for their respective next rising are obtained.

FIG. 5 is a schematic diagram showing the relationship between a new light output target value which is updated in a next rising of a light output for each of RGB, using a light output adjustment value obtained last time and a rising of a light output for each of RGB obtained by the new light output target value.

(1) For an R light output, since the light output adjustment value X is b/a, the multiplication unit 111 multiplies an R-light output target value by b/a to delay the rising of the R-light output target value and thereby obtains an updated light output target value. Specifically, the R-light output target value is provided in a form in which the value gradually rising, instead of in a rectangular form. In this case, a light output target value obtained by multiplying an original light output target value by b/a is reached at the timing of time t.

(2) For a G light output, since the light output adjustment value Y is "1", the multiplication unit 121 multiplies a G-light output target value by "1" to update the light output target value. In this case, the light output target value after update remains the same with no change from that before update. In this case, since the rising of the G light source is slowest, the G-light output target value is in a rectangular form, as with the original one.

(3) For a B light output, since the light output adjustment Z is b/c, the multiplication unit 131 multiplies a B-light output target value by b/c to delay the rising of the B-light output target value and thereby obtains an updated light output target value. Specifically, the B-light output target value is provided in a form in which the value gradually rising, instead of in a rectangular form. In this case, a light output target value obtained by multiplying an original light output target value by b/c is reached at the timing of time t.

In this manner, the rising of light output target values of the R-semiconductor laser 41 and the B-semiconductor laser 43 are delayed in accordance with the rising of the slowest G-semiconductor laser 42. As such, since each of the ratios of the respective RGB light outputs can be adjusted to b at the timing of time t, the rising of RGB can match one another. Accordingly, a balance between RGB colors can be kept.

A light output control device according to the present invention is useful as a control device that controls light outputs from RGB laser light sources used as a light source of a display backlight. In the light output control device, when there is a difference in the rising of light output between RGB upon start-up, since the rising of light sources other than a light source with the slowest rising can be adjusted to the slowest rising, the rising of semiconductor lasers for the respective RGB colors can match one another, enabling to prevent color balance from being lost.

As described above, although the present invention has been described in detail with reference to a preferred embodiment thereof, the present invention is not limited thereto. It will be obvious to those skilled in the art that many varied preferred embodiments and modified preferred embodiments are possible within the technical scope of the present invention described in the following scope of claims.

The invention claimed is:

1. A light output control device for laser light sources that controls light outputs from laser light sources for respective RGB colors, the light output control device comprising three sets for respective RGB colors, each set including:
   (a) a semiconductor laser operable to output a light of one of the RGB colors;
   (b) a light output detection unit operable to detect a light output from the semiconductor laser;
   (c) a light output adjustment unit operable to update a light output target value;
   (d) a light output control unit operable to control the semiconductor laser based on the updated light output target value; and
   (e) a division unit operable to divide the output from the light output detection unit by an output from the light output adjustment unit to obtain a ratio of a rising of the light output from the semiconductor laser,
   wherein the light output control device further comprises a rising determination unit for determining, based on detection results obtained by the respective division unit for the respective RGB, rising of output of the semiconductor laser with slowest rising from among the semiconductor lasers for the respective RGB colors and outputting light output adjustment values for the respective semiconductor lasers for the respective RGB, wherein
   the light output adjustment unit for the respective RGB updates their respective light output target values based on the light output adjustment values for the respective RGB outputted from the rising determination unit, and
   the light output control unit for the respective RGB causes their respective corresponding semiconductor lasers to operate in accordance with a semiconductor laser whose light output rising time is slowest, based on the updated light output target values to keep RGB color balance upon activation.

2. The light output control device for laser light sources according to claim 1, wherein the rising determination unit determines speeds of rising of light outputs from the semiconductor lasers for the respective RGB by comparing magnitudes of the ratios of rising obtained by dividing outputs from the light output detection unit for the respective RGB respectively by outputs from the light output adjustment unit for the respective RGB.

3. The light output control device for laser light sources according to claim 1, wherein the rising determination unit outputs light output adjustment value for adjusting the light output target values for the respective RGB, based on the ratios of rising obtained by dividing outputs from the light output detection unit for the respective RGB respectively by outputs from the light output adjustment unit for the respective RGB,
   (i) the rising determination unit outputs "1" for a light output with a slowest rising among the RGB as a light output adjustment value; and
   (ii) the rising determination unit outputs, for each of other light outputs, a value obtained by dividing a ratio of the rising of the light output with the slowest rising by a ratio of the rising of the light output as a light output adjustment value.

4. The light output control device for laser light sources according to claim 3,
   wherein, before a fixed period of time from start-up has elapsed, the rising determination unit outputs the light output adjustment values by performing a predetermined operation; and
   wherein, after the fixed period of time from activation has elapsed, the rising determination unit outputs, for all the RGB light outputs, a fixed value "1" as the light output adjustment value so as not to perform a rising adjustment operation.

5. The light output control device for laser light sources according to claim 1, wherein the light output adjustment unit for the respective RGB multiply their respective light output target values by their respective corresponding light output adjustment values outputted from the rising determination unit to update the light output target values to new light output target values.

* * * * *